United States Patent
Iwasaki et al.

(10) Patent No.: US 9,634,644 B2
(45) Date of Patent: Apr. 25, 2017

(54) ACOUSTIC WAVE ELEMENTS AND ANTENNA DUPLEXERS, AND MODULES AND ELECTRONIC DEVICES USING SAME

(71) Applicant: SKYWORKS FILTER SOLUTIONS JAPAN CO., LTD., Kadoma-Shi (JP)

(72) Inventors: Tomohiro Iwasaki, Shiga-Ken (JP); Hiroyuki Nakamura, Osaka-Fu (JP)

(73) Assignee: SKYWORKS FILTER SOLUTIONS JAPAN CO., LTD., Kadoma-Shi (JP)

( * ) Notice: Subject to any disclaimer, the term of this patent is extended or adjusted under 35 U.S.C. 154(b) by 0 days.

(21) Appl. No.: 14/811,132

(22) Filed: Jul. 28, 2015

(65) Prior Publication Data
US 2016/0028372 A1 Jan. 28, 2016

Related U.S. Application Data

(63) Continuation of application No. PCT/JP2015/003717, filed on Jul. 24, 2015.

(30) Foreign Application Priority Data

Jul. 28, 2014 (JP) ................................. 2014-152547

(51) Int. Cl.
*H03H 9/72* (2006.01)
*H01P 5/12* (2006.01)
(Continued)

(52) U.S. Cl.
CPC ........... *H03H 9/725* (2013.01); *H01P 1/2135* (2013.01); *H01P 5/12* (2013.01); *H03H 3/08* (2013.01);
(Continued)

(58) Field of Classification Search
CPC .... H03H 3/08; H03H 9/02992; H03H 9/6433; H03H 9/6483; H03H 9/725; H01P 1/2135; H01P 5/12; H01P 11/007
(Continued)

(56) References Cited

U.S. PATENT DOCUMENTS 7,042,131 B2 * 5/2006 Takamine .......... H03H 9/02834
    29/25.35
7,327,205 B2 * 2/2008 Taniguchi .............. H03H 9/725
    333/133
(Continued)

FOREIGN PATENT DOCUMENTS

| JP | H11-88101 A | 3/1999 |
| JP | 2005-210475 A | 8/2005 |
| WO | 2011/142183 A1 | 11/2011 |

OTHER PUBLICATIONS

International Search Report and Written Opinion from corresponding PCT Application No. PCT/JP2015/003717 dated Nov. 3, 2015.

*Primary Examiner* — Barbara Summons
(74) *Attorney, Agent, or Firm* — Lando & Anastasi, LLP

(57) ABSTRACT

An acoustic wave element according to certain examples includes a piezoelectric body, an interdigital transducer (IDT) electrode disposed above the piezoelectric body, and a connection electrode disposed above the piezoelectric body and connected to the IDT electrode. A first insulation layer covers the connection electrode, and a second insulation layer covers the IDT electrode. The first insulation layer disposed above the connection electrode has a first thickness T in a direction perpendicular to an upper surface of the piezoelectric body and the second insulation layer disposed above the IDT electrode has a second thickness K in the direction perpendicular to the upper surface of the piezoelectric body. The first thickness T is less than the second thickness K.

19 Claims, 6 Drawing Sheets

(51) Int. Cl.
  *H03H 3/08*   (2006.01)
  *H03H 9/02*   (2006.01)
  *H01P 1/213*  (2006.01)
  *H01P 11/00*  (2006.01)

(52) U.S. Cl.
  CPC ....... *H03H 9/02992* (2013.01); *H01P 11/007* (2013.01)

(58) Field of Classification Search
  USPC .......................................... 333/133, 193–196
  See application file for complete search history.

(56) References Cited

U.S. PATENT DOCUMENTS

| | | | |
|---|---|---|---|
| 7,688,161 B2* | 3/2010 | Miura | H03H 9/6483 |
| | | | 310/313 B |
| 8,093,961 B2* | 1/2012 | Kawamoto | H03H 9/02952 |
| | | | 333/133 |
| 8,629,598 B2* | 1/2014 | Yamane | H03H 9/0222 |
| | | | 310/313 A |
| 2003/0038562 A1* | 2/2003 | Ikada | H03H 3/08 |
| | | | 310/313 B |
| 2003/0174028 A1 | 9/2003 | Takayama et al. | |
| 2008/0012450 A1 | 1/2008 | Meister et al. | |
| 2012/0019102 A1 | 1/2012 | Seki et al. | |
| 2013/0162368 A1 | 6/2013 | Tsurunari et al. | |
| 2015/0021290 A1* | 1/2015 | Tsuda | H03H 3/08 |
| | | | 216/13 |

* cited by examiner

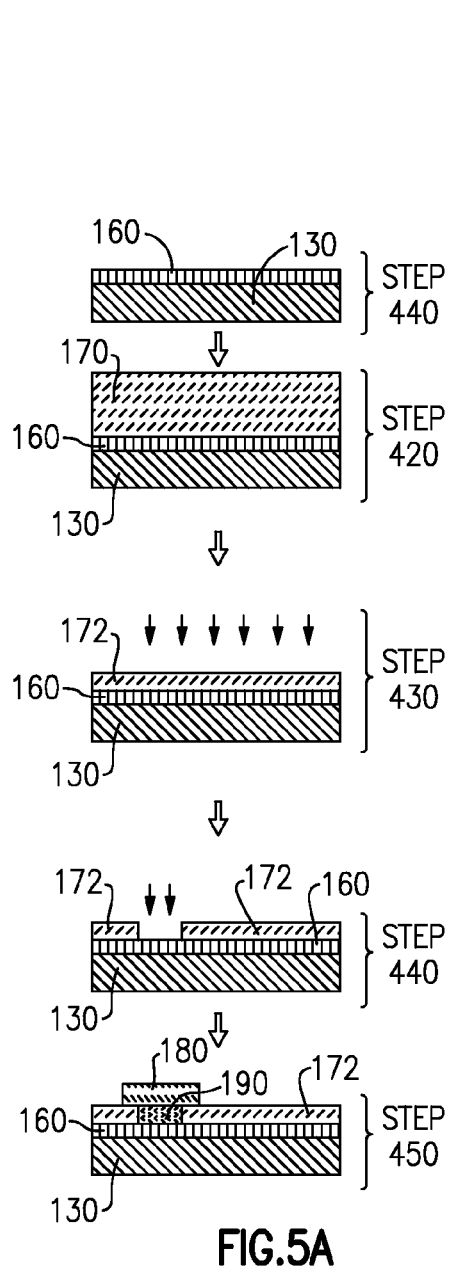
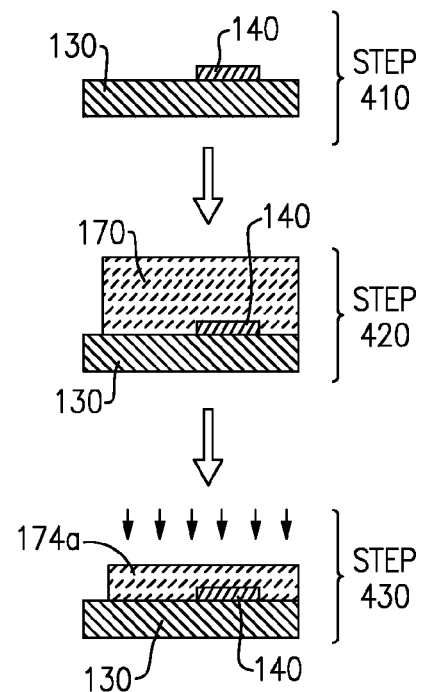
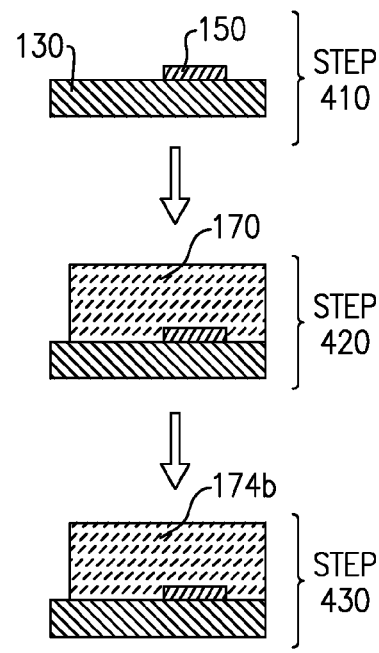
FIG.5A
FIG.5B
FIG.5C

ACOUSTIC WAVE ELEMENTS AND ANTENNA DUPLEXERS, AND MODULES AND ELECTRONIC DEVICES USING SAME

CROSS REFERENCE TO RELATED APPLICATIONS

This application claims the benefit of priority under 35 U.S.C. §119 and PCT Article 8 to co-pending JP Patent Application No. 2014-152547 filed on Jul. 28, 2014, which is incorporated herein by reference in its entirety for all purposes. This application also claims priority under 35 U.S.C. §120 to co-pending International Application No. PCT/JP2015/003717 filed on Jul. 24, 2015, which is incorporated herein by reference in its entirety for all purposes.

BACKGROUND

Field of Invention

Aspects and embodiments relate generally to an acoustic wave element, an antenna duplexer using the same, and an electronic device using the antenna duplexer.

Discussion of Related Art

A conventional antenna duplexer generally includes a transmission filter and a reception filter. The transmission filter may include a first interdigital transducer (IDT) electrode configured as a transmission resonator on a piezoelectric body. The reception filter may include a second IDT electrode configured as a reception resonator on the piezoelectric body. Each IDT electrode is covered with an insulation layer. U.S. Patent Application Publication No. 2012/0019102 discloses an example of such a conventional antenna duplexer.

SUMMARY OF INVENTION

Conventional acoustic wave elements such as may be used in the above-mentioned antenna duplexer may require a longer lead time in a manufacturing process and there is a need for the manufacturing process to be simplified.

To address this issue, aspects and embodiments are directed to an improved acoustic wave element and manufacturing process thereof. According to one embodiment, an acoustic wave element comprises a piezoelectric body, an interdigital transducer (IDT) electrode disposed above the piezoelectric body, a connection electrode disposed above the piezoelectric body and connected to the IDT electrode, a first insulation layer covering the connection electrode, and a second insulation layer covering the IDT electrode. The first insulation layer is disposed above the connection electrode and has a first thickness T in a direction perpendicular to an upper surface of the piezoelectric body, and the second insulation layer is disposed above the IDT electrode and has a second thickness K in the direction perpendicular to the upper surface of the piezoelectric body, the first thickness T being less than the second thickness K. According to the aforementioned configuration, the example of the acoustic wave element may allow the manufacturing process to be simplified, and a highly-reliable acoustic wave element may be achieved. In particular, as discussed in more detail below, the relationship between the thickness of the insulation layer on the upper surface of the IDT electrode and that of the connection electrode may allow the manufacturing process of the acoustic wave element to be greatly simplified.

According to one embodiment, an acoustic wave element comprises a piezoelectric body, an interdigital transducer (IDT) electrode disposed above the piezoelectric body, a connection electrode disposed above the piezoelectric body and connected to the IDT electrode, a first insulation layer covering the connection electrode and having a first thickness T above the connection electrode in a direction perpendicular to an upper surface of the piezoelectric body, and a second insulation layer covering the IDT electrode and including a first portion having a second thickness K above the IDT electrode in the direction perpendicular to the upper surface of the piezoelectric body, the second thickness K being greater than the first thickness T.

Various embodiments of the acoustic wave element may include any one or more of the following features.

In one example of the acoustic wave element, the IDT electrode includes a first IDT electrode forming a first filter and a second IDT electrode forming a second filter, the first portion of the second insulation layer being disposed above the second IDT electrode, and the second insulation layer further including a second portion disposed above the first IDT electrode and having a third thickness S in the direction perpendicular to the upper surface of the piezoelectric body, the third thickness S being different from the second thickness K. In one example in which the acoustic wave element is an antenna duplexer, the first filter is configured as a reception filter of the antenna duplexer to pass a first signal in a first frequency band, and the second filter is configured as a transmission filter of the antenna duplexer to pass a second signal in a second frequency band different from the first frequency band.

In one example, the third thickness S is approximately equal to the first thickness T.

In another example, the first insulation layer and the second insulation layer are made of a same material. In one example the material of the first and second insulation layers is oxidized silicon. In another example the material of the first and second insulation layers is silicon nitride.

In one example the IDT electrode includes first and second layers arranged in the direction perpendicular to the upper surface of the piezoelectric body, the first layer being made of a material different from that of the second layer. The materials of the first and second layers of the IDT electrode can be selected from a group consisting of aluminum, copper, gold, titanium, tungsten, molybdenum, platinum, chromium, and an alloy composed mainly of one or more of these metals, for example. In another example, the IDT electrode is made of a single metal element selected from a group consisting of aluminum, copper, gold, titanium, tungsten, molybdenum, platinum, and chromium.

The acoustic wave element may further comprise an extraction electrode connected to the connection electrode and disposed above the connection electrode, and an external terminal electrode connected to the extraction electrode and disposed above the extraction electrode.

The acoustic wave element may further comprise a wiring electrode disposed above the first insulation layer and insulated from the connection electrode by the first insulation layer. In one example the first insulation layer includes a first portion disposed above the connection electrode and having the first thickness T, and a second portion disposed between the connection electrode and the wiring electrode and having a fourth thickness W in the direction perpendicular to the upper surface of the piezoelectric body, the fourth thickness W being less than the second thickness K.

According to another embodiment, an electronic device comprises an example of the above-described acoustic wave element, a semiconductor element connected to the acoustic wave element, and a reproduction device connected to the semiconductor element.

Another embodiment is directed to a module including an example of the above-described acoustic wave element.

Further embodiments are directed to communications device including an example of the acoustic wave element or the module.

According to another embodiment, an antenna duplexer comprises a piezoelectric body, a first filter including a first interdigital transducer (IDT) electrode disposed above the piezoelectric body, a second filter including a second IDT electrode disposed above the piezoelectric body, and a connection electrode disposed above the piezoelectric body and connected to the first and second IDT electrodes. A first insulation layer is disposed over the connection electrode and has a first thickness T above the connection electrode in a direction perpendicular to an upper surface of the piezoelectric body. The antenna duplexer further includes a second insulation layer including a first portion disposed over the first IDT electrode and having a second thickness S above the first IDT electrode in the direction perpendicular to the upper surface of the piezoelectric body, and a second portion disposed over the second IDT electrode and having a third thickness K above the second IDT electrode in the direction perpendicular to the upper surface of the piezoelectric body. The second thickness S is approximately equal to the first thickness T, and the third thickness K is greater than the first thickness T.

In one example in which the first filter is a reception filter and the second filter is a transmission filter, the first IDT electrode includes a first series resonator connected to an antenna terminal by the connection electrode, a second series resonator connected to the first series resonator in series by the connection electrode and connected to an output terminal, and a first parallel resonator connected to the first series resonator by the connection electrode. The second IDT electrode may include a third series resonator connected to the antenna terminal by the connection electrode, a fourth series resonator connected to the third series resonator in series by the connection electrode in series and connected to an input terminal, and a second parallel resonator connected to the third series resonator by the connection electrode.

Still other aspects, embodiments, and advantages of these exemplary aspects and embodiments are discussed in detail below. Embodiments disclosed herein may be combined with other embodiments in any manner consistent with at least one of the principles disclosed herein, and references to "an embodiment," "some embodiments," "an alternate embodiment," "various embodiments," "one embodiment" or the like are not necessarily mutually exclusive and are intended to indicate that a particular feature, structure, or characteristic described may be included in at least one embodiment. The appearances of such terms herein are not necessarily all referring to the same embodiment.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures:

FIG. 5A is a process flow diagram illustrating in cross-section structural aspects corresponding to the manufacturing process of FIG. 4 for an example of the acoustic wave element of FIG. 1 taken along line A-AA in FIG. 1;

FIG. 5B is a process flow diagram illustrating in cross-section structural aspects corresponding to the manufacturing process of FIG. 4 for the example of the acoustic wave element of FIG. 1 taken along line B-BB in FIG. 1;

FIG. 5C is a process flow diagram illustrating in cross-section structural aspects corresponding to the manufacturing process of FIG. 4 for the example of the acoustic wave element of FIG. 1 taken along line C-CC in FIG. 1;

DETAILED DESCRIPTION

As discussed above, aspects and embodiments are directed to an acoustic wave element, and manufacturing process thereof, the acoustic wave element having a structure that allows the manufacturing process to be greatly simplified relative to conventional processes.

It is to be appreciated that embodiments of the methods and apparatuses discussed herein are not limited in application to the details of construction and the arrangement of components set forth in the following description or illustrated in the accompanying drawings. The methods and apparatuses are capable of implementation in other embodiments and of being practiced or of being carried out in various ways. Examples of specific implementations are provided herein for illustrative purposes only and are not intended to be limiting. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and the like are intended for convenience of description, not to limit the present systems and methods or their components to any one positional or spatial orientation. In particular, as described below terms indicating directions such as "above," "below," "upper surface," "lower surface" and the like are used for designating relative directions depending only on a relative positional relationship between components included in embodiments of the acoustic wave element, such as a substrate, an IDT electrode and the like, and therefore are not intended to designate absolute directions such as a vertical direction for example.

Figure 1:
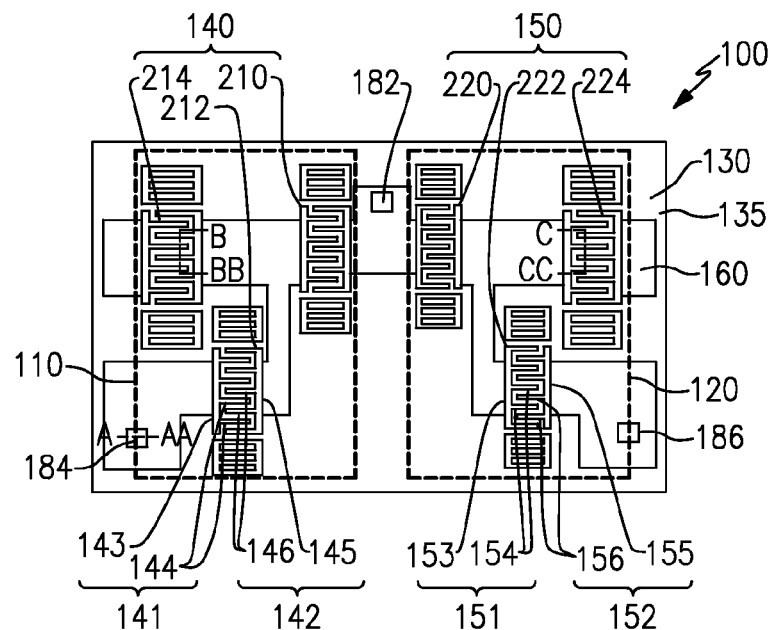
FIG. 1 is a plan view showing an example of an acoustic wave element according to the present invention.

FIG. 1 is a plan view showing an example of an acoustic wave element according to certain embodiments. In the example of FIG. 1, the acoustic wave element is exemplified as an antenna duplexer 100 suitable for CDMA standard Band 8. The antenna duplexer 100 includes a first filter 110 and a second filter 120. The first filter 110 may be a reception filter to allow signals in a first frequency band, for example, ranging from 925 MHz to 960 MHz for CDMA standard Band 8, to pass as reception signals. The second filter 120 may be a transmission filter to allow signals in a second frequency band lower than the reception frequency band, for example, ranging from 880 MHz to 915 MHz for CDMA standard Band 8, to pass as transmission signals.

The acoustic wave element includes a piezoelectric body 130, and a first interdigital transducer (IDT) electrode 140 and a second IDT 150 disposed on an upper surface 135 of the piezoelectric body 130. The acoustic wave element further includes a connection electrode 160 disposed on the upper surface 135 and electrically connecting the first IDT electrode 140 to the second IDT electrode 150, and insulation 170 (shown in FIGS. 2A-2C and 5A-5C and discussed further below) covering the upper surface 135, the first IDT electrode 140, the second IDT electrode 150, and the connection electrode 160.

The first IDT electrode 140 may include comb-shaped electrodes 141 and 142 arranged opposed to each other. The comb-shaped electrode 141 may include a bus bar 143 and a plurality of electrode fingers 144 extending from the bus bar 143 in parallel. The comb-shaped electrode 142 similarly may include a bus bar 145 and a plurality of electrode fingers 146 extending from the bus bar 145 in parallel and overlapped with the electrode fingers 144.

The second IDT electrode 150 may include comb-shaped electrodes 151 and 152 arranged opposite to each other. The comb-shaped electrode 151 may include a bus bar 153 and a plurality of electrode fingers 154 extending from the bus bar 153 in parallel. The comb-shaped electrode 152 may include a bus bar 155 and a plurality of electrode fingers 156 extending from the bus bar 155 in parallel and overlapped with the electrode fingers 154.

The first filter 110 as a reception filter may include a first series resonator 210 connected to an antenna terminal 182 via the connection electrode 160, a second series resonator 212 connected to the series resonator 210 via the connection electrode 160 in series, an output terminal 184 connected to the second series resonator 212, and a parallel resonator 214 connected to the first series resonator 210 via the connection electrode 160.

The second filter 120 as a transmission filter may include a first series resonator 220 connected to the antenna terminal 182 via the connection electrode 160, a second series resonator 222 connected to the series resonator 220 via the connection electrode 160 in series, an input terminal 186 connected to the second series resonator 222, and a parallel resonator 224 connected to the first series resonator 220 via the connection electrode 160.

Each of the antenna terminal 182, the output terminal 184, and the input terminal 186 may function as an external terminal electrode 180 for connections to external circuitry.

In one example the piezoelectric body 130 includes a material made, for example, based on lithium niobate, lithium tantalate, potassium niobate, quartz, and the like.

Figure 2A:
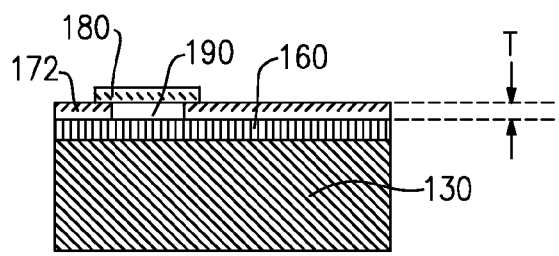
FIG. 2A is a cross-sectional view of the example of the acoustic wave element of FIG. 1 taken along line A-AA in FIG. 1.
Figure 2B:
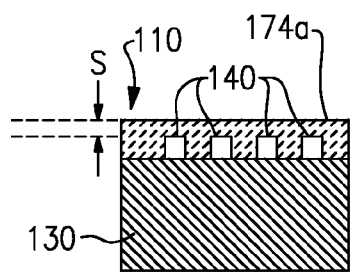
FIG. 2B is a cross-sectional view of the example of the acoustic wave element of FIG. 1 taken along line B-BB in FIG. 1.
Figure 2C:
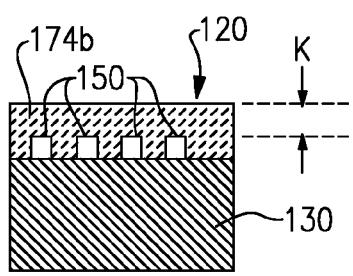
FIG. 2C is a cross-sectional view of the example of the acoustic wave element of FIG. 1 taken along line C-CC in FIG. 1.

Examples of the first IDT electrode 140, the second IDT electrode 150, and the insulation layer 170 according to certain embodiments are described with reference to FIGS. 2A-2C and 5A-5C. FIG. 2A is a cross-sectional view of the example of the acoustic wave element exemplified as antenna duplexer 100 taken along line A-AA in FIG. 1. FIG. 2B shows a cross-sectional view of the first filter 110 taken along line B-BB in FIG. 1. FIG. 2C shows a cross-sectional view of the second filter 120 taken along line C-CC in FIG. 1.

Each of the first IDT electrode 140 and the second IDT electrode 150 may be made, for example, of a single metal element, such as, aluminum, copper, gold, titanium, tungsten, molybdenum, platinum or chromium, an alloy composed mainly of one or more of these metal elements, or a multi-layered structure thereof. The multi-layered structure may be exemplified as a layered structure in which a first layer and a second layer (not shown) are layered in the direction perpendicular to the upper surface 135 of the piezoelectric body 130 in the first IDT electrode 140 and the second IDT electrode 150. Furthermore, the material of the first layer may be different from that of the second layer.

The insulation 170 may be made of an oxide material having an increased insulation performance, such as a medium mainly composed of oxidized silicon, for example. The insulation 170 may have a layered structure. The layered structure of the insulation 170 is not limited to any specific structure, and a multi-layered structure with a different material such as silicon nitride may be implemented.

The connection electrode 160 may be electrically connected to the external terminal electrode 180 via an extraction electrode 190. The material of the extraction electrode 190 is not limited to a specific material; however, in the interest of simplifying the manufacturing process of the acoustic wave element, the material may preferably be a same material as that used for the first IDT electrode 140, the second IDT electrode 150, and the connection electrode 160. Similar to the extraction electrode 190, the material of the external terminal electrode 180 is not limited to a specific material; however, in the interest of simplifying the manufacturing process of the acoustic wave element, the material may preferably be a same material as that used for the first IDT electrode 140, the second IDT electrode 150, and the connection electrode 160.

It is to be appreciated that, although described above and illustrated as separate, in other embodiments the connection electrode 160, the extraction electrode 190, and the external terminal electrode 180 may have a monolithic structure formed with a same material.

Furthermore, when the connection electrode 160 is formed simultaneously and integrally with the first IDT electrode 140 and the second IDT electrode 150 in a thin film deposition process, the first IDT electrode 140 and the second IDT electrode 150 may preferably be made of a same material in order to simplify the manufacturing process. Still furthermore, the extraction electrode 190 and the external terminal electrode 180 may preferably be made of a same material and in a same configuration as those of the connection electrode 160, the first IDT electrode 140, and the second IDT electrode 150 similar to the above in order to simplify the manufacturing process.

Referring now to FIGS. 2A-2C, the insulation 170 used in embodiments of the acoustic wave element is described in terms of the thicknesses thereof. An insulation layer disposed on the upper surface of the connection electrode 160 is designated as a first insulation layer 172 and a thickness thereof is designated as T. An insulation layer disposed on the upper surface of the first IDT electrode 140 and the second IDT electrode 150 is designated as a second insulation layer 174, and a thickness of a first portion 174a thereof on the first IDT electrode 140 is designated as S, whereas a thickness of a second portion 174b thereof on the second IDT electrode 150 is designated as K. According to one embodiment, the thickness T of the first insulation layer 172 on the connection electrode 160 is less than the thickness K of the second portion of the second insulation layer 174 on the second IDT electrode 150. With this configuration, the time required for etching the first insulation layer 172 to form the extraction electrode 190 may be reduced such that the manufacturing process of the acoustic wave element may be simplified. Furthermore, the thickness S of the first portion of the second insulation layer 174 on the upper surface of the first IDT electrode 140 may preferably be made approximately equal to the thickness T of the first insulation layer 172 in order to further simplify the manufacturing process.

In the example illustrated in FIG. 1, the first IDT electrode 140 is part of the first (reception) filter 110, and the second IDT electrode 150 is part of the second (transmission) filter 120; however, it is to be appreciated that the thickness magnitude relationship between the insulation layers 172, 174a, and 174b on the respective upper surfaces is not limited based on the designation of the reception filter or the transmission filter.

Figure 3A:
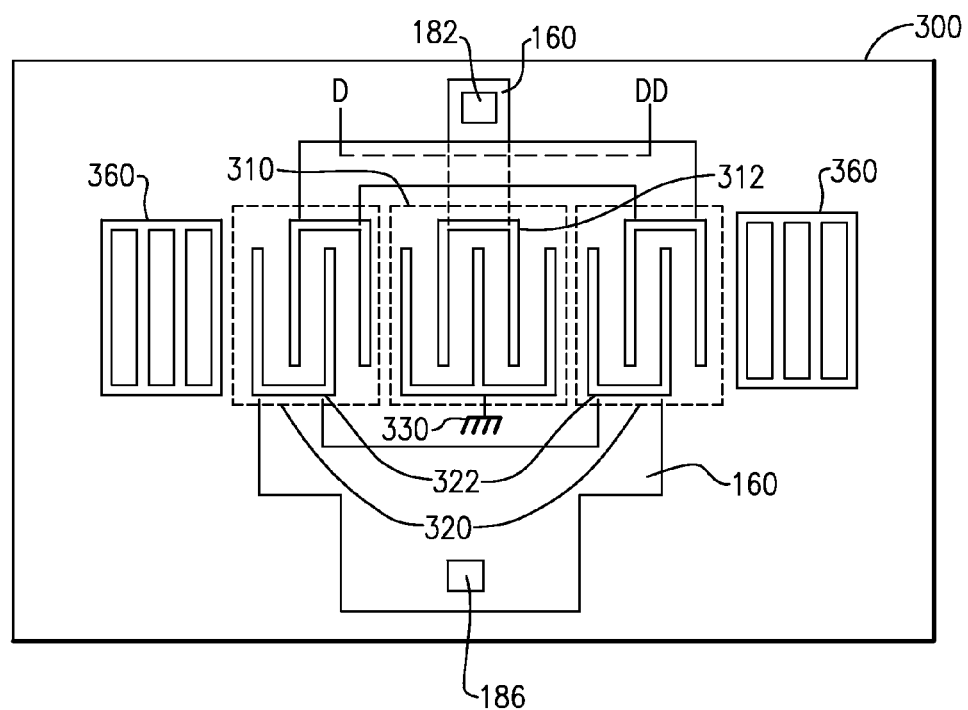
FIG. 3A is a plan view showing another example of an acoustic wave element according to aspects of the present invention.
Figure 3B:
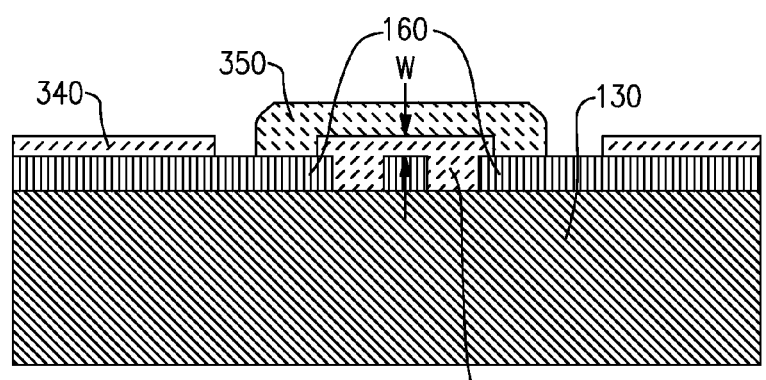
FIG. 3B is a cross-sectional view of the example of the acoustic wave element of FIG. 3A taken along line D-DD in FIG. 3A.

FIGS. 3A and 3B illustrate another embodiment of an acoustic wave element according to certain aspects. In particular, FIGS. 3A and 3B show an acoustic wave element exemplified as an example of a DMS (Double-Mode-SAW) filter 300. The DMS filter 300 can replace either or both of the first filter 110 and/or the second filter 120 in the antenna duplexer 100 of FIG. 1. FIG. 3A is a plan view of the DMS filter 300, and FIG. 3B is a cross-sectional view taken along line D-DD in FIG. 3A.

Referring to FIG. 3A, the DMS filter 300 includes a central IDT electrode 310 formed by a pair of comb-shaped electrodes 312, and two side IDT electrodes 320 each disposed in a propagation direction of an acoustic wave and formed by a pair of comb-shaped electrodes 322. In certain examples, the DMS filter 300 further includes reflectors 360 disposed on opposite sides of the two side IDT electrodes 320.

According to one embodiment, one of the comb-shaped electrodes 312 forming the central IDT electrode 310 is be connected to a GND electrode 330 facing an output terminal 186 via the connection electrode 160, whereas the other of the comb-shaped electrodes 312 is be connected to an antenna terminal 182 via the connection electrode 160. Two of the comb-shaped electrodes 322 forming the two side IDT electrodes 320 and arranged facing the antenna terminal 182 may be electrically connected to each other via the connection electrode 160, and the other two comb-shaped electrodes 322 arranged facing the output terminal 186 opposed to the antenna terminal 182 may also be electrically connected to each other via the connection electrode 160.

In one example, the two comb-shaped electrodes 322 of the two side IDT electrodes 320 facing the antenna terminal 182 can have an electric potential different from that of the comb-shaped electrodes 312 of the central IDT electrode 310 facing the antenna terminal 182 and may not be electrically connected to the comb-shaped electrodes 312. For example, the electrodes having different electrical potentials may be wired in a three-dimensionally crossing manner interposing an insulator between the electrodes in order to avoid a complex two-dimensional circuit wiring structure.

For purposes of description, an insulation layer disposed on an upper surface of the central IDT electrode 310 and the two side IDT electrodes 320 is designated as a third insulation layer 340. The third insulation layer 340 is not shown in FIG. 3A for clarity of the drawing. No cross-sectional views of the central IDT electrode 310 and the two side IDT electrodes 320 in the DMS filter 300 are shown in the drawings because the cross-sectional views correspond to those of the first IDT electrode 140 and the second IDT electrode 150, respectively, of the first filter 110 and the second filter 120 as shown in FIGS. 2B and 2C.

Referring to FIG. 3B, the DMS filter 300 can include a wiring electrode 350 routed above the connection electrode 160 via the third insulation layer 340. In one example, a first portion 342 of the third insulation layer 340 disposed between the connection electrode 160 and the wiring electrode 350 has a thickness W in a direction perpendicular to the upper surface 135 of the piezoelectric body 130. The thickness W may preferably be less than a thickness of a second portion the third insulation layer 340 disposed above the central IDT electrode 310 or the two side IDT electrodes 320 in the direction perpendicular to the upper surface of the piezoelectric body 130.

In the case where the wiring electrode 350 is formed by a vapor deposition process, the third insulation layer 340 may be formed so thick that the coverage of the wiring electrode 350 may be degraded and furthermore it can be possible that the wiring electrode 350 has such a locally thinned portion that the electrode may have a greater than desirable resistance. Accordingly, to avoid such problems, the thickness W of the first portion of the insulation layer 340 may preferably be made as thin as possible provided that an insulating effect can be maintained between the connection electrode 160 and the wiring electrode 350. In this case, the resistivity can be sufficiently low for the electrodes to operate properly.

Figure 4:
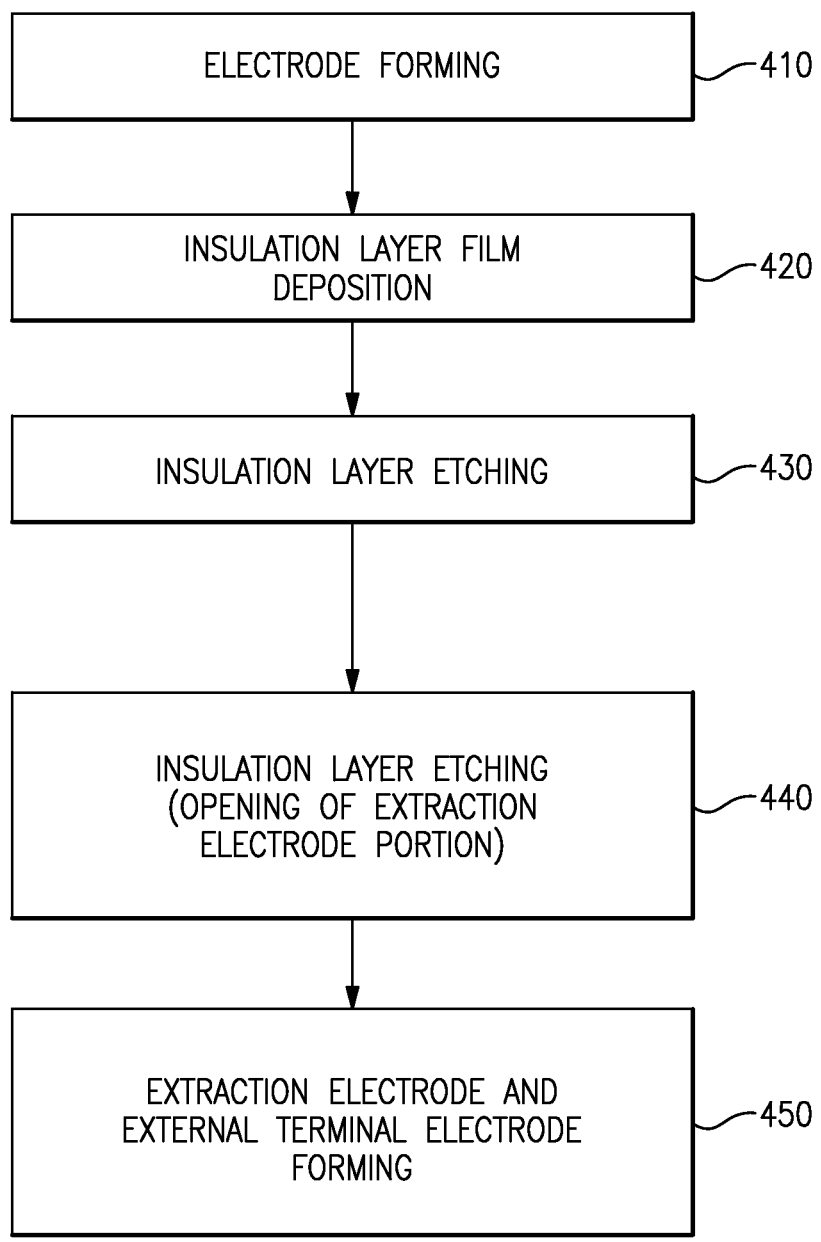
FIG. 4 is a process flow diagram showing one example of a manufacturing process for an example of an acoustic wave element according to aspects of the present invention.

Referring to FIG. 4, there is illustrated a flow diagram for one example of a manufacturing process, or relevant portion thereof, for an example of an acoustic wave element according to certain embodiments. FIG. 5A shows the resulting structure in cross-sectional view, corresponding to FIG. 2A, taken long line A-AA in FIG. 1. FIG. 5B shows the resulting structure in cross-sectional view, corresponding to FIG. 2B, taken long line B-BB in FIG. 1. FIG. 5C shows the resulting structure in cross-sectional view, corresponding to FIG. 2C, taken long line C-CC in FIG. 1.

As shown in FIGS. 4 and 5A-5C, the first IDT electrode 140, the second IDT electrode 150, and the connection electrode 160 of desired shapes can be simultaneously and integrally formed on the upper surface of the piezoelectric body 130 using masks in an electrode forming step 410.

In step 420, the insulation 170 is formed on the upper surfaces of each electrode and the piezoelectric body 130. Step 420 can be a film deposition step.

Next, the insulation 170 may be processed in an etching step 430. In step 430, the first portion of the second insulation layer 174a on the upper surface of the first IDT electrode 10 may be etched more than the second portion of the second insulation layer 174b on the upper surface of the second IDT electrode 150, such that the first portion of the second insulation layer 174a on the upper surface of the first IDT electrode 140 may be formed thinner than the second portion of the second insulation layer 174b on the upper surface of the second IDT electrode 150, as may be seen with reference to FIGS. 5B and 5C. This relative thickness configuration may improve an electromechanical coupling coefficient of the acoustic wave element. In certain embodiments, in step 420 the thickness of the insulation 170 can be made to be the desired thickness of the second portion of the second insulation layer 174b so that the etching step 430 can be avoided in the regions corresponding to the second portion of the second insulation layer 174b.

Also in the etching step 430, the first insulation layer 172 on the upper surface of the connection electrode 160 may be selectively etched together with the first portion of the second insulation layer 174a on the upper surface of the first IDT electrode 140 in a same single step. Accordingly, the thickness S of the first portion of the second insulation layer 174a may be approximately equal to the thickness T of the first insulation layer 172. This may reduce an etching time of the first insulation layer 172 to form the extraction electrode 190 in step 440 and therefore may achieve a simplified manufacturing process. In step 450 the extraction electrode 190 is formed, and the external terminal electrode 180 is also formed.

Figure 6:
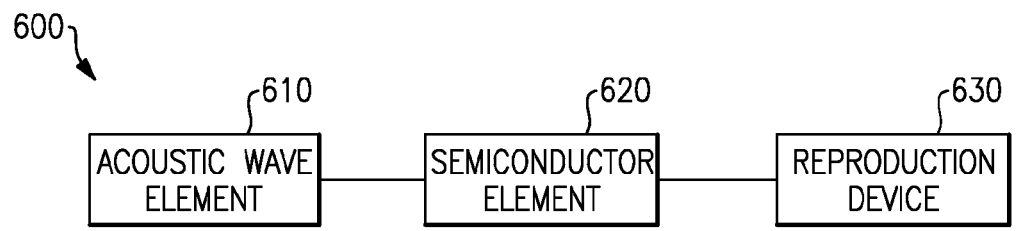
FIG. 6 is a block diagram schematically showing an example of an electronic device using an example of an acoustic wave element according to aspects of the present invention.

FIG. 6 is a block diagram schematically showing an example of an electronic device 600 using an example of an acoustic wave element 610. The electronic device may be used in a cell phone or the like, for example. As shown in FIG. 6, the electronic device 600 according to this example can include an acoustic wave element 610, a semiconductor element 620 connected to the acoustic wave element 610, and a reproduction device 630 connected to the semiconductor element 620. The acoustic wave element 610 can include examples of the antenna duplexer 100 and/or DMS filter 300 discussed above. The reproduction device 630 can form a display unit such as a liquid crystal panel, a sound reproduction unit such as a speaker, or the like. Using the acoustic wave element 610 according to the example of the present invention in the electronic device 600 may provide a more highly-reliable electronic device 600 at lower cost.

The acoustic wave element 610 according to examples and embodiments disclosed herein may achieve the effect of improving mass-production capability of the acoustic wave element 610, and may be useful in a variety of electronic devices 600, such as a cell phone or other mobile or wireless communication device.

Figure 7:
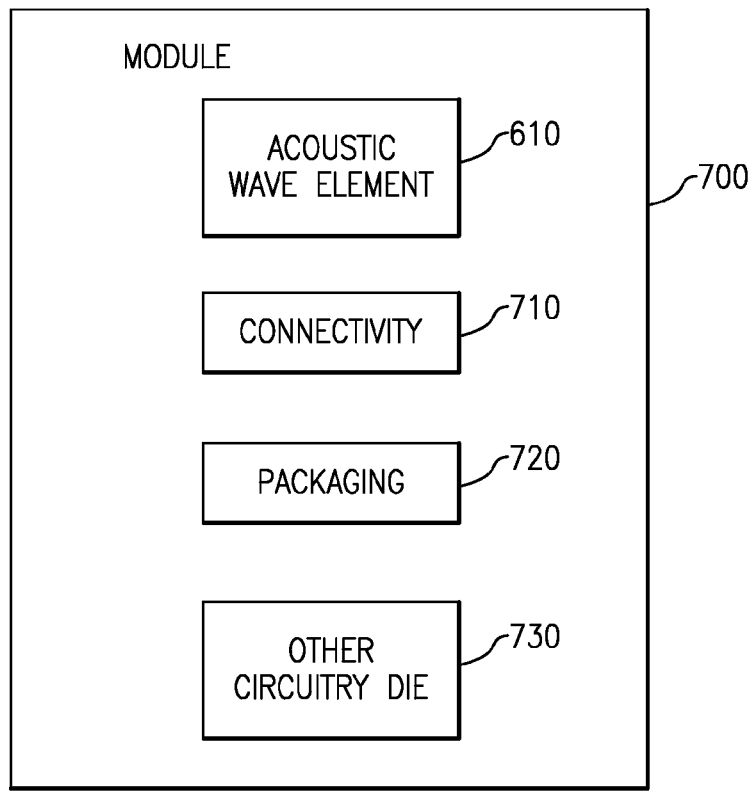
FIG. 7 is a block diagram schematically showing an example of a module using an example of an acoustic wave element according to aspects of the present invention.

Further, embodiments of the acoustic wave element 610 may be incorporated into a module that may ultimately be used in a device, such as a wireless communications device, for example, so as to provide a module having enhanced performance. FIG. 7 is a block diagram illustrating one example of a module 700 including the acoustic wave element 610. As discussed above, the acoustic wave element 610 can include examples of the antenna duplexer 100 and/or the DMS filter 300. The module 700 further includes connectivity 710 to provide signal interconnections, packaging 720, such as for example, a package substrate, for packaging of the circuitry, and other circuitry die 730, such as, for example amplifiers, pre-filters, modulators, demodulators, down converters, and the like, as would be known to one of skill in the art of semiconductor fabrication in view of the disclosure herein.

Figure 8:
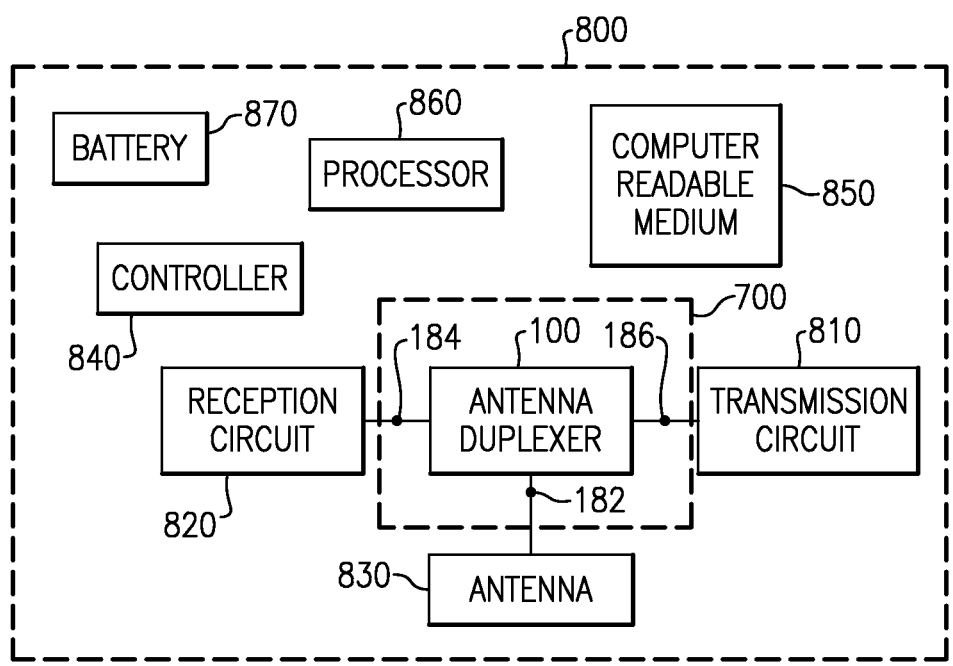
FIG. 8 is a block diagram schematically showing an example of a communication device using an example of an acoustic wave element according to aspects of the present invention.

As discussed above, configuring an electronic device to use embodiments of the acoustic wave element 610 can achieve the effect of realizing a communication device, for example, having enhanced performance. FIG. 8 is a schematic block diagram of one example of a communication device 800 (e.g., a wireless or mobile device, such as a cell phone) that can include an embodiment of the antenna duplexer 100, optionally including the DMS filter 300 in either or both of the reception and transmission filters, as discussed above. The communication device 800 can represent a multi-band and/or multi-mode device such as a multi-band/multi-mode mobile phone, for example. In certain embodiments, the communication device 800 can include the antenna duplexer 100, a transmission circuit 810 connected to the antenna duplexer via the input terminal 186, a reception circuit 820 connected to the antenna duplexer 600 via the output terminal 184, and an antenna 830 connected to the antenna duplexer via the antenna terminal 182. The transmission circuit 810 and reception circuit 820 may be part of a transceiver that can generate RF signals for transmission via the antenna 830 and can receive incoming RF signals from the antenna 830. As discussed above, in certain embodiments, the antenna duplexer 100 can be replaced with the module 700 which includes the antenna duplexer. The communication device 800 can further include a controller 840, a computer readable medium 850, at least one processor 860, and a battery 870.

It will be understood that various functionalities associated with the transmission and receiving of RF signals can be achieved by one or more components that are represented in FIG. 8 as the transmission circuit 810 and the reception circuit 820. For example, a single component can be configured to provide both transmitting and receiving functionalities. In another example, transmitting and receiving functionalities can be provided by separate components. Similarly, it will be understood that various antenna functionalities associated with the transmission and receiving of RF signals can be achieved by one or more components that are collectively represented in FIG. 8 as the antenna 830. For example, a single antenna can be configured to provide both transmitting and receiving functionalities. In another example, transmitting and receiving functionalities can be provided by separate antennas. In yet another example in which the communication device is a multi-band device, different bands associated with the communication device 800 can be provided with different antennas.

To facilitate switching between receive and transmit paths, the antenna duplexer 100 can be configured to electrically connect the antenna 830 to a selected transmit or receive path. Thus, the antenna duplexer 100 can provide a number of switching functionalities associated with an operation of the communication device 800. In addition, as discussed above, the antenna duplexer 100 includes the transmission filter 120 and reception filter 110, which are configured to provide filtering of the RF signals.

As shown in FIG. 8, in certain embodiments, a controller 840 can be provided for controlling various functionalities associated with operations of the antenna duplexer 100 and/or other operating component(s). In certain embodiments, the at least one processor 860 can be configured to facilitate implementation of various processes for operation of the communication device 800. The processes performed by the at least one processor 860 may be implemented by computer program instructions. These computer program instructions may be provided to the at least one processor 860, which can be a general purpose computer, a special purpose computer, or another programmable data processing apparatus to produce a machine, such that the instructions, which execute via the at least one processor of the computer or other programmable data processing apparatus, create a mechanism for operating the communication device 800. In certain embodiments, these computer program instructions may also be stored in the computer-readable medium 850. The battery 870 can be any suitable battery for use in the communication device 800, including, for example, a lithium-ion battery.

Having described above several aspects of at least one embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

What is claimed is:

1. An acoustic wave element comprising:
  a piezoelectric body;
  an interdigital transducer (IDT) electrode disposed above the piezoelectric body;
  a connection electrode disposed above the piezoelectric body and connected to the IDT electrode;
  a first insulation layer covering the connection electrode and having a first thickness above the connection electrode in a direction perpendicular to an upper surface of the piezoelectric body;
  a second insulation layer covering the IDT electrode and including a first portion having a second thickness above the IDT electrode in the direction perpendicular to the upper surface of the piezoelectric body, the second thickness being greater than the first thickness; and
  a wiring electrode disposed above the first insulation layer and insulated from the connection electrode by the first insulation layer.

2. The acoustic wave element of claim 1 wherein the IDT electrode includes a first IDT electrode forming a first filter and a second IDT electrode forming a second filter, the first portion of the second insulation layer being disposed above the second IDT electrode, and the second insulation layer further including a second portion disposed above the first IDT electrode and having a third thickness in the direction perpendicular to the upper surface of the piezoelectric body, the third thickness being different from the second thickness.

3. The acoustic wave element of claim 2 wherein the acoustic wave element is an antenna duplexer, the first filter being configured as a reception filter of the antenna duplexer to pass a first signal in a first frequency band, and the second filter being configured as a transmission filter of the antenna duplexer to pass a second signal in a second frequency band different from the first frequency band.

4. The acoustic wave element of claim 2 wherein the third thickness is equal to the first thickness.

5. The acoustic wave element of claim 1 wherein the first insulation layer and the second insulation layer are made of a same material.

6. The acoustic wave element of claim 5 wherein the material of the first and second insulation layers is oxidized silicon.

7. The acoustic wave element of claim 5 wherein the material of the first and second insulation layers is silicon nitride.

8. The acoustic wave element of claim 1 wherein the IDT electrode includes first and second layers arranged in the direction perpendicular to the upper surface of the piezoelectric body, the first layer being made of a material different from that of the second layer.

9. The acoustic wave element of claim 8 wherein the materials of the first and second layers of the IDT electrode are selected from a group consisting of aluminum, copper, gold, titanium, tungsten, molybdenum, platinum, chromium, and an alloy composed mainly of one or more of these metals.

10. The acoustic wave element of claim 1 wherein the IDT electrode is made of a single metal element selected from a group consisting of aluminum, copper, gold, titanium, tungsten, molybdenum, platinum, and chromium.

11. The acoustic wave element of claim 1 further comprising an extraction electrode connected to the connection electrode and disposed above the connection electrode, and an external terminal electrode connected to the extraction electrode and disposed above the extraction electrode.

12. The acoustic wave element of claim 1 wherein the first insulation layer includes a first portion disposed above the connection electrode and having the first thickness, and a second portion disposed between the connection electrode and the wiring electrode and having a fourth thickness in the direction perpendicular to the upper surface of the piezoelectric body, the fourth thickness being less than the second thickness.

13. An electronic device comprising:
  the acoustic wave element of claim 1;
  a semiconductor element connected to the acoustic wave element; and
  a reproduction device connected to the semiconductor element.

14. A module comprising the acoustic wave element of claim 1.

15. A communications device including the module of claim 14.

16. A communications device including the acoustic wave element of claim 1.

17. An antenna duplexer comprising:
  a piezoelectric body;
  a first filter including a first interdigital transducer (IDT) electrode disposed above the piezoelectric body;
  a second filter including a second IDT electrode disposed above the piezoelectric body;
  a connection electrode disposed above the piezoelectric body and connected to the first and second IDT electrodes;
  a first insulation layer disposed over the connection electrode and having a first thickness above the connection electrode in a direction perpendicular to an upper surface of the piezoelectric body;
  a second insulation layer including a first portion disposed over the first IDT electrode and a second portion disposed over the second IDT electrode, the first portion having a second thickness above the first IDT electrode in the direction perpendicular to the upper surface of the piezoelectric body, the second thickness being approximately equal to the first thickness, the second portion having a third thickness above the second IDT electrode in the direction perpendicular to the upper surface of the piezoelectric body, the third thickness being greater than the first thickness; and a wiring electrode disposed above the first insulation layer and insulated from the connection electrode by the first insulation layer.

18. The antenna duplexer of claim 17 wherein the first filter is a reception filter and the second filter is a transmission filter, the first IDT electrode including a first series resonator connected to an antenna terminal by the connection electrode, a second series resonator connected to the first series resonator in series by the connection electrode and connected to an output terminal, and a first parallel resonator connected to the first series resonator by the connection electrode.

19. The antenna duplexer of claim 18 wherein the second IDT electrode includes a third series resonator connected to the antenna terminal by the connection electrode, a fourth series resonator connected to the third series resonator in series by the connection electrode in series and connected to an input terminal, and a second parallel resonator connected to the third series resonator by the connection electrode.

* * * * *